United States Patent [19]

Yano et al.

[11] Patent Number: 4,712,219
[45] Date of Patent: Dec. 8, 1987

[54] VISIBLE DOUBLE HETEROSTRUCTURE-SEMICONDUCTOR LASER

[75] Inventors: Seiki Yano; Saburo Yamamoto, both of Nara; Haruhisa Takiguchi, Osaka; Shinji Kaneiwa, Nara, all of Japan

[73] Assignee: Sharp Kabushiki Kaisha, Osaka, Japan

[21] Appl. No.: 716,222

[22] Filed: Mar. 26, 1985

[30] Foreign Application Priority Data

Mar. 29, 1984 [JP] Japan .................................. 59-62287

[51] Int. Cl.$^4$ ......................... H01S 3/19; H01L 33/00
[52] U.S. Cl. ........................................ 372/45; 357/16; 357/17; 372/44; 372/46; 372/48
[58] Field of Search ...................... 357/17, 16; 372/45, 372/46, 44, 43, 48

[56] References Cited

U.S. PATENT DOCUMENTS

4,360,919  12/1982  Fujiwara et al. ..................... 372/45

FOREIGN PATENT DOCUMENTS

69608   6/1982  European Pat. Off. .
0027095 2/1982  Japan ................................... 372/48

OTHER PUBLICATIONS

"Barga et al.", Composition Dependence of Energy Gap in CaInAs Alloys Journal of Applied Physics, vol. 48, No. 10, Oct. 1975, p. 4608.
Applied Physics Letters, American Inst. of Physics, vol. 26, No. 9, 5/1/75, pp. 528–531, "Room-temperature Heterojunction Laser . . .".
Japanese Journal of Applied Physics, vol. 21, No. 12, Dec. 1982, pp. L731-L733, "MOCVD-grown ALO.-5InO.5P-GaO Double Hetero. . . .".
Applied Physics Letters, Amer. Inst. of Physics, vol. 29, No. 12, Dec. 1976, pp. 807–809, "CW Room-temperature InxGAl-xAs/InyGal. . .".

Primary Examiner—James W. Davie
Assistant Examiner—Georgia Y. Epps
Attorney, Agent, or Firm—Spencer & Frank

[57] ABSTRACT

A visible double heterostructure-semiconductor laser comprising an InGaAs, InAlP, InAlAs, InAlSb or InGaSb layer, a first cladding layer on the InGaAs, InAlP, InAlAs, InAlSb or InGaSb layer; an active layer on the first cladding layer and a second cladding layer on the active layer, wherein a mixed crystal of, respectively InGaAs, InAlP, InAlAs, InAlSb or InGaSb is used, as a substrate crystal for growing of said InGaAs, InAlP, InAlAs, InAlSb or InGaSb layer thereon, and the composition ratio of the substrate crystal and of each of the layers is selected so as to result in the approximate coincidence between the lattice constant of the substrate crystal and the lattice constant of each of these layers, an energy difference of 0.2 eV or more between the direct transition and the indirect transition within said active layer, and an energy difference of 0.2 eV or more between the active layer and either of the first or the second cladding layers.

11 Claims, 4 Drawing Figures

VISIBLE DOUBLE HETEROSTRUCTURE-SEMICONDUCTOR LASER

BACKGROUND OF THE INVENTION

1. Field of the Invention

This invention relates to a semiconductor laser having a doubleheterostructure in which cladding layers are formed on each of both faces of an active layer.

2. Description of the Prior Art

To shorten oscillation wavelength from a semiconductor laser is advantageous in that the diameter of focused beams in an optical disk can be reduced, thereby increasing the amount of information that can be written therein, and the depth of focus of an optical disk can be increased. Also, it is advantageous in that the sensitivity of a laser beam printer can be improved due to an improved photosensitivity curve of the photoconductive member therein.

However, as the oscillation wavelength from a semiconductor laser, in which the lattice constant of a substrate crystal coincides with the lattice constant of each of all layers successively formed on the substrate crystal, is shortened, the energy difference between the direct transition and the indirect transition within the active layer becomes small thereby increasing the distribution proportion of current carriers injected into the direct transition region to the indirect transition region, resulting in an increase in the threshold current level of the semiconductor lase. Moreover, the energy difference between the active layer and the cladding layers becomes small, so that current carrier injected into the active layer flow to the cladding layers resulting in an increase ni the threshold current level, as well.

On the contrary, in a semiconductor laser in which the lattice constant of a substrate crystal does not coincide with the lattice constant of each of all layers successively formed on the substrate crystal, the energy difference therebetween can be maintained at a high level, while crystal defects result from the uncoincidence between the lattice constants so that the threshold current increaases and/or the lifetime is reduced.

SUMMARY OF THE INVENTION

The semicondutor laser of this invention which overcomes the above-discussed disadvantages and numerous other drawbacks and deficiencies of the prior art, comprises an InGaAs, InAlP, InAlAs, InAlSb or InGaSb layer, InAlSb or InGaSb layer; an active layer on the cladding layer and a second cladding layer on the active layer, wherein a mixed crystal of InGaAs, InAlP, InAlAs, InAlSb or InGaSb is used, respectively as a substrate crystal for growing of said InGaAs, InAlP, InAlAs, InAlSb or InGaSb layer thereon, and the composition ratios of the substrate crystal and of each of the layers are selected so as to result in the approximate conicidence between the lattice constant of the substrate crystal and the lattice constant of each of these layers, an energy difference of 0.2 eV or more between the direct transition and the indirect transition within said active layer, and an energy difference of 0.2 eV or more between the active layer and either of the first or the second cladding layers.

The active layer is composed of InGaP in a selected composition ratio and each of the said cladding layers is composed of InAlP, in a selected composition ratio, resulting in an energy difference mentioned above.

The mixed crystal of InGaAs with a composition ratio gradient ranging in composition from $In_{0.0}Ga_{1.0}As$ to $In_{0.16}Ga_{0.84}As$ is, in a preferred embodiment, grown on a GaAs substrate to form the InGaAs layer, the bottom of which is of the composition of GaAs and the top of which is of the composition of $In_{0.16}Ga_{0.84}As$.

A striped portion having a V-shaped groove is, in a preferred embodiment, formed in the region from the substrate crystal to the InGaAs layer.

Thus, the invention described herein makes possible the objects of providing a semiconductor laser having a low threshold current level and a long life.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
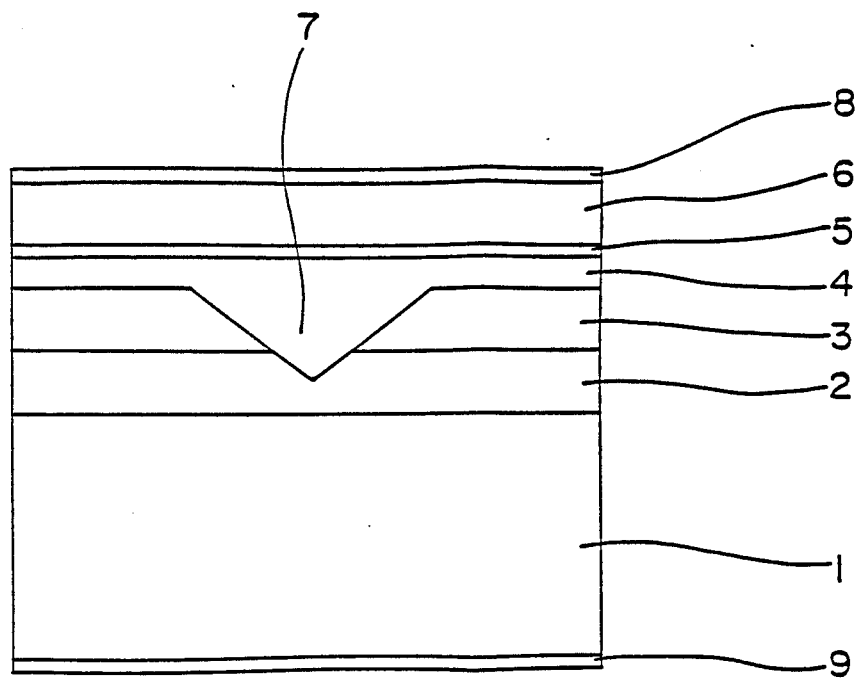
FIG. 1 is a diagrammatical view showing a semiconductor laser according to this invention.

A semiconductor laser according to this invention is produced as follows:

As shown in FIG. 1, a p-$In_{0.16}Ga_{0.84}As$ layer 2 and an n-$In_{0.16}Ga_{0.84}As$ layer 3 are successively grown on a p-GaAs substrate 1 by a chemical vapor deposition method or a molecular beam epitaxy method, wherein a mixed crystal of InGaAs with a composition ratio gradient ranging in composition from $In_{0.0}Ga_{1.0}As$ to $In_{0.16}Ga_{0.84}As$ is grown on the GaAs substrate 1 resulting in the InGaAs layer 2, the bottom of which is of the composition of GaAs and the top of which is of the composition of $In_{0.16}Ga_{0.84}As$, so that a lack of coincidence between the lattice constant of the GaAs substrate 1 and the lattice constant of the $In_{0.16}Ga_{0.84}As$ layer 2 can be minimixed or eliminated. The thicknesses of these layers 2 and 3 are 1 μm, respectively.

On the resulting wafer, a striped portion 7 having a V-shaped groove of a width of 4 μm and a depth of 1.2 μm is formed by a photoetching technique. Then, on the resulting wafer, a p-$In_{0.64}Al_{0.36}P$ cladding layer 4 (the thickness thereof being 1 μm), an $In_{0.65}Ga_{0.35}P$ active layer 5 (the thickness thereof being 0.1 μm) and an n-$In_{0.64}Al_{0.36}P$ cladding layer 6 (the thickness thereof being 1 μm) are successively grown by liquid phase epitaxy to form a double heterostructure, followed by the formation of electrodes 8 and 9 on the surface of the n-InAlP cladding layer 6 and the back face of the GaAs substrate 1 by a known technique such as an evaporation process, respectively, resulting in a semiconductor laser having a double heterostructure. Since the semiconductor laser has the striped portion 7 in the region from the p-InGaAs layer 2 to the n-InGaAs layer 3, the current injected into the active layer 5 is allowed to flow into the striped portion 7 alone and a built-in refractive index distribution is obtained to prevent the light from expanding to the outside of the striped portion 7 thereby attaining stabilization in the oscillation mode.

The above-mentioned GaAs substrate can be removed as desired upon completion of the semiconductor laser.

Instead of InGaAs, a mixed crystal of one selected from InAlP, InAlAs, InAlSb and InGaSb with a composition ratio gradient can be used as a substrate crystal therefor, resulting in the approximate coincidence between the lattice constant of the substrate crystal and the lattice constant of the first cladding layer.

Figure 2:
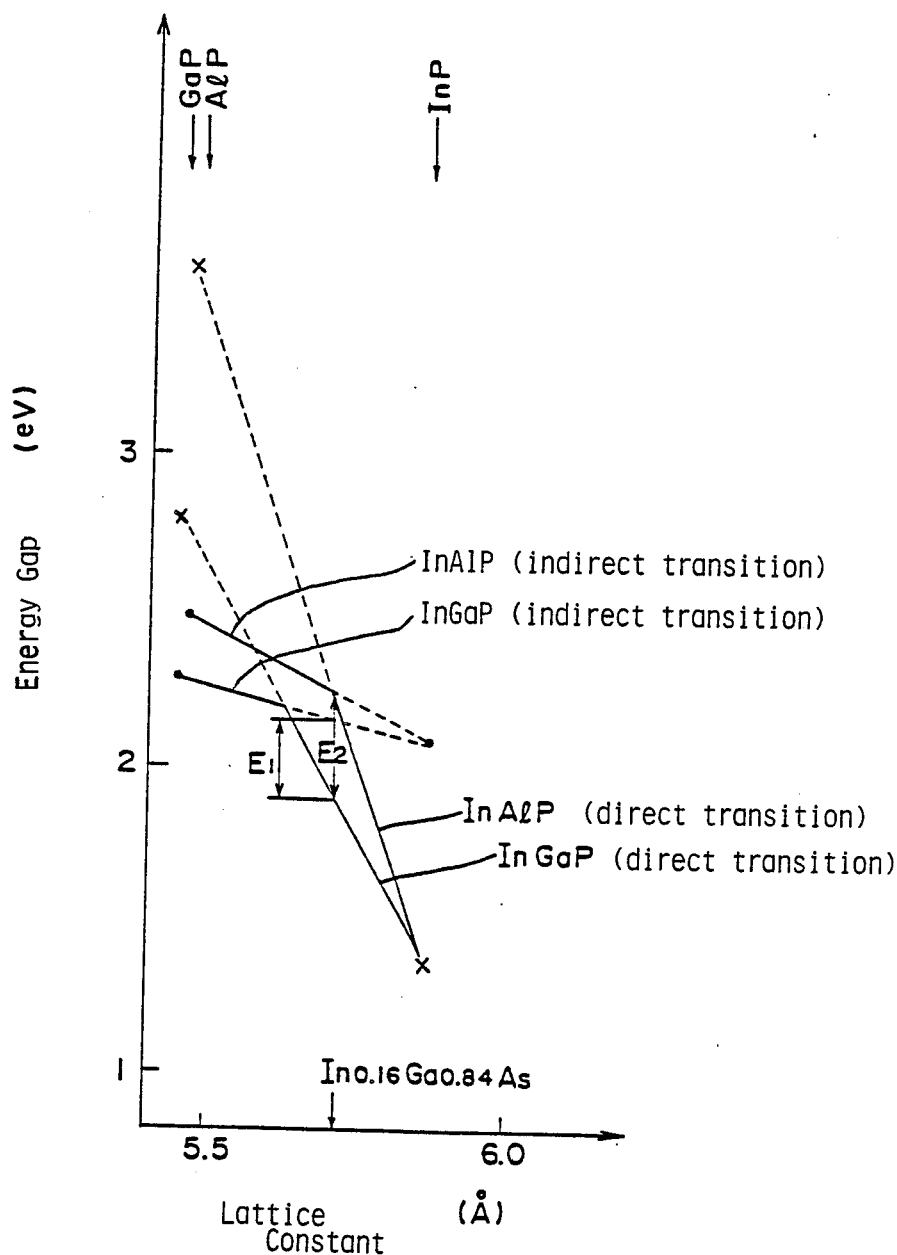
FIG. 2 is a graph showing the relationship between the lattice constants and the energy gap in the semiconductor laser.
Figure 3:
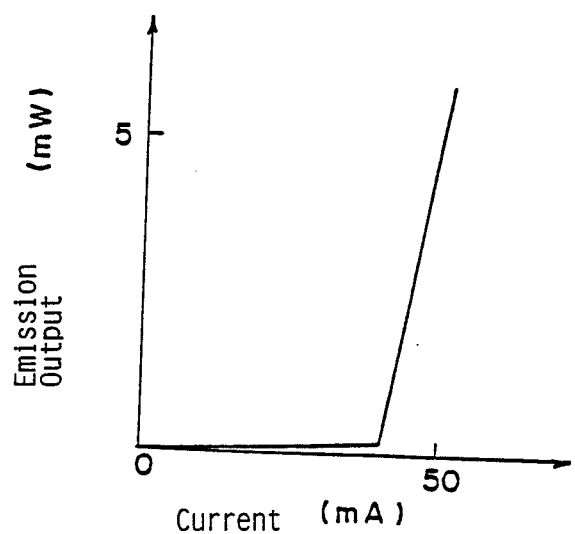
FIG. 3 is a graph showing the relationship between the current and the output of the semiconductor laser.
Figure 4:
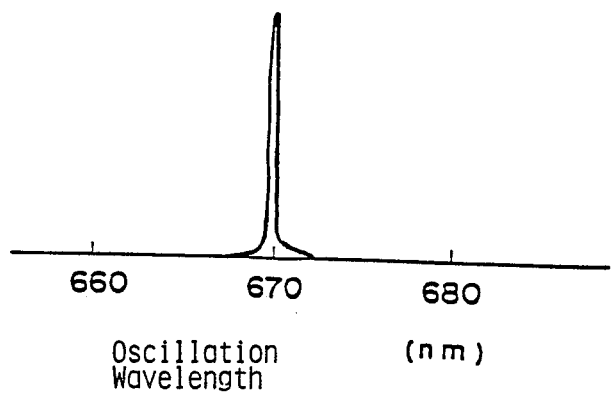
FIG. 4 is an oscillation spectral diagram of the semiconductor laser.

FIG. 2 indicates that the above-mentioned double heterostructure semiconductor laser has the energy difference $E_1$ of 0.2 eV or more between the direct transition and the indirect transition within the $In_{0.65}Ga_{0.35}P$ active layer 5 and the energy difference $E_2$ of 0.2 eV or more between the $In_{0.65}Ga_{0.35}P$ active layer 5 and the $In_{0.64}Al_{0.36}P$ cladding layer 4 or 6. When the semiconductor laser was operated, as shown in FIGS. 3 and 4, a shortened wavelength oscillation of 670 nm was detected at a threshold current of 40 mA.

Although the above embodiment describes the oscillation wavelength of 670 nm resulting from the composition ratio of the mixed crystal which constitutes each layer, as seen from FIG. 2, each of the energy differences $E_1$ and $E_2$ can be maintained at a level of 0.25 eV or more in the region where the oscillation wavelength is longer than 670 nm.

As mentioned above, the semiconductor laser of this invention is constructed in such a manner that the lattice constant of the substrate crystal has a gradient to coincide with the lattice constant of each of the layers, and accordingly the introduction of crystal defects theeinto can be eliminated thereby reducing the threshold current level and improving the life of the laser.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In a visible double heterostructure-semiconductor laser comprising:
    a substrate crystal of a first conductivity type;
    a first electrode formed under said substrate crystal;
    a first layer of a second conductivity type formed on said substrate crystal;
    a first cladding layer of the first conductivity type formed on said first layer;
    an active layer formed on said first cladding layer;
    a second cladding layer of the second conductivity type formed on said active layer; and
    a second electrode formed on said second cladding layer; the improvement wherein: said substrate crystal is a mixed crystal consisting of InGaAs, InAlP, InAlAs, InAlSb, or InGaSb;
    said first layer consists of the same mixed crystal as said substrate crystal; and
    the composition ratios of said substrate crystal and of each of said layers are selected such that the lattice constants of said substrate crystal and of said layers substantially coincide, an energy difference of 0.2 eV or more exists betwen the direct transition and the indirect transition within said active layer, and an energy difference of 0.2 eV or more exists between said active layer and either of said first and second cladding layers.

2. A visible double heterostructure-semconductor laser according to claim 1, wherein said active layer is composed of InGaP and each of the said cladding layers is composed of InAlP.

3. A visible double heterostructure-semiconductor laser according to claim 1, wherein a striped portion having a V-shape is formed in the region from said substrate crystal to said first layer.

4. A visible double heterostructure-semiconductor laser according to claim 1, wherein: a semiconductor substrate is disposed between said substrate crystal and said first electrode; and the composition ratio of the mixed crystal of said substrate crystal is gradually changed in the lamination direction so as to minimize any lack of coincidence between the lattice constant of said semiconductor substrate and that of said substrate crystal.

5. A visible double heterostructure-semiconductor laser according to claim 4, wherein: said semiconductor substrate consists of GaAs; and said substrate mixed crystal consists of InGaAs with a composition ratio gradient ranging from $In_{0.0}Ga_{1.0}As$ to $In_{0.16}Ga_{0.84}As$ with the bottom of said substrate crystal being of the composition of GaAs and the top of said substrate crystal being of the composition of $In_{0.16}Ga_{0.84}As$.

6. A visible double heterostructure-semiconductor laser according to claim 4 wherein said semiconductor substrate is of said first type of conductivity.

7. A visible double heterostructure-semiconductor laser according to claim 4, wherein said first cladding layer has a striped portion with a V-shape which extends through said first layer into said substrate crystal.

8. A visible double heterostructure-semiconductor laser according to claim 1, wherein said first cladding layer is provided with a striped portion having a V-shape which extends through said first layer into said substrate crystal.

9. A visible double heterostructure-semiconductor laser according to claim 2, wherein said first layer consists of InGaAs of a desired composition ratio.

10. A visible double heterostructure-semiconductor laser according to claim 9, wherein: a semiconductor substrate of GaAs on which said substrate crystal was grown is disposed between said substrate crystal and said first electrode; and said substrate crystal has a composition ratio ranging from $In_{0.0}Ga_{1.0}As$ at its interface with said substrate and said desired composition ratio at its interface with said first layer.

11. A visible double heterostructure-semiconductor laser according to claim 10, wherein said substrate is of said first type of conductivity; and said first layer consists of $In_{0.16}Ga_{0.84}As$.

* * * * *